United States Patent [19]

Saletta et al.

[11] Patent Number: 4,734,639

[45] Date of Patent: Mar. 29, 1988

[54] MASTER METERING MODULE WITH VOLTAGE SELECTOR

[75] Inventors: Gary F. Saletta; Daniel P. Orange, both of Penn Township, Westmoreland County; Joseph C. Engel, Monroeville Boro, all of Pa.; Denis A. Mueller, Asheville, N.C.; Robert T. Elms, Monroeville Boro, Pa.

[73] Assignee: Westinghouse Electric Corp., Pittsburgh, Pa.

[21] Appl. No.: 868,834

[22] Filed: May 29, 1986

[51] Int. Cl.$^4$ .............................. G01R 19/00
[52] U.S. Cl. .................. 324/107; 324/73 R; 324/115; 364/483
[58] Field of Search .......... 324/73 R, 115, 107; 364/483

[56] References Cited

U.S. PATENT DOCUMENTS

| | | | |
|---|---|---|---|
| 3,130,366 | 4/1964 | Draper | 324/73 R |
| 4,023,101 | 5/1977 | Christoffer | 324/107 |
| 4,623,967 | 11/1986 | Naimer | 364/483 |
| 4,641,090 | 2/1987 | Danby | 324/107 |

Primary Examiner—Reinhard J. Eisenzopf
Assistant Examiner—Stephen M. Baker
Attorney, Agent, or Firm—M. J. Moran

[57] ABSTRACT

A master metering module is taught which utilizes a programmed microprocessor and externally operated switches to alert the module as to what kind of system is being monitored thereby. For example, is the system being monitored a Δ-connected electrical system or a Y-connected electrical system. This is useful in providing output indications of line-to-line voltage or line-to-neutral voltage, for example. When measuring voltages whether line-to-line or line-to-neutral one voltage value is substituted from another. A differential amplifier is utilized to do this. In one case the differential amplifier subtracts one line voltage from another line voltage, but in another case it subtracts neutral or zero ground potential from a line voltage. A switching arrangement is provided which interconnects one terminal of the differential amplifier with the neutral input terminal and with a line input terminal through appropriate conditioning of the microprocessor.

6 Claims, 9 Drawing Figures

MASTER METERING MODULE WITH VOLTAGE SELECTOR

CROSS-REFERENCE TO RELATED APPLICATIONS

The subject matter of this invention is related to subject matter disclosed and claimed in concurrently filed, copending application Ser. No. 868,833 entitled "Master Metering Module with Digital Saturation Adjuster and Method for Use Thereof" by D. P. Orange, J. C. Engel, G. F. Saletta and D. A. Mueller, and Ser. No. 868,832 entitled "Process for Manufacturing Electrical Equipment Utilizing Printed Circuit Boards" by S. L. Glover both of which are assigned to the same assignee as the assignee of the present invention.

BACKGROUND OF THE INVENTION

The subject matter of this invention relates generally to metering devices and more specifically to metering devices of the kind which are adapted to a wide range of metering for different kinds of electrically connected systems and which use microprocessor control and digital readout.

The concept of metering is well known in the art. Furthermore, the concept of utilizing microprocessor controlled metering in which multiple circuit functions are sensed and operated upon by solid-state and digital circuitry utilized in conjunction with a controlling microprocessor to provide a useful function is also well known in the art. Examples of such can be found in U.S. Pat. No. 4,456,867 entitled "Motor Control Apparatus with Input Validator" issued June 26, 1984 to Mallick, Jr. et al.; U.S. Pat. No. 4,461,986 entitled "Motor Control Apparatus with Phase Related Detector" issued July 24, 1984 to Maynard et al., U.S. Pat. No. 4,467,260 entitled "Motor Control Apparatus with Rotor Heating Protection" issued Aug. 21, 1984 to Mallick, Jr. et al. and U.S. Pat. No. 4,476,423 entitled "Motor Control Apparatus with Motor Starts Per Time Period Limiter" issued Oct. 9, 1984 to Mallick, Jr. et al. When one utilizes metering techniques it is usually necessary to adjust the electrical interconnection between the system to be monitored and the apparatus which is doing the monitoring. This usually requires custom installation or the use of an electrician to adapt and physically configure the metering package with the system which is to be monitored. Because of this, the cost associated with installing such equipment is relatively high. It would be advantageous if a master metering module could be found which could be standardized to eliminate the high cost associated with custom installation thus lowering the overall cost for installing and utilizing the system could be lowered.

SUMMARY OF THE INVENTION

In accordance with the invention, a master metering module is taught which is adapted for relatively simple installation and use with a wide diversity of electrical systems. In particular, the present master metering module is adapted for simplified use with either a Δ-connected electrical system or a Y-connected electrical system without requiring custom installation. In particular, circuit apparatus of the kind which produces an output signal which is related to the difference between a first line voltage and either a second line voltage or neutral is taught. The system includes terminal means upon which combinations of the first line voltage, said second line voltage and neutral are interconnected. There is also provided a microprocessor controlled switch having an output terminal and first and second input terminals. The first input terminal is connected to receive the second line voltage and the second input terminal is connected to the neutral where the neutral is employed. The latter switch also has a control terminal which is utilized to internally connect either the first switch input terminal to an output terminal thereof or the second switch input terminal to an output terminal thereof. There is also provided a differential means which may be a differential amplifier which has a pair of input terminals for being interconnected at one to the first line voltage and for being interconnected at the other to the output terminal of the microprocessor controlled switch. The microprocessor controls the control terminal of the switch in accordance with a condition stored in the microprocessor for providing a control signal to the switch for interconnecting either the first switch input terminal through the switch output terminal to the other input terminal of the differential means or for connecting the second switch input terminal through the output terminal thereof to the other input terminal of the differential means so that the output signal of the differential means is related to the difference between the first line voltage and the second line voltage or the difference between the first line voltage and neutral depending upon the condition of the microprocessor. The microprocessor is programmed to read a switch arrangement to determine whether the first switch arrangement or the second switch arrangement is to be utilized.

BRIEF DESCRIPTION OF THE DRAWINGS

For better understanding of the invention, reference may be had to the preferred embodiment thereof shown in the accompanying drawings in which.

DESCRIPTION OF THE PREFERRED EMBODIMENT

Figure 1:
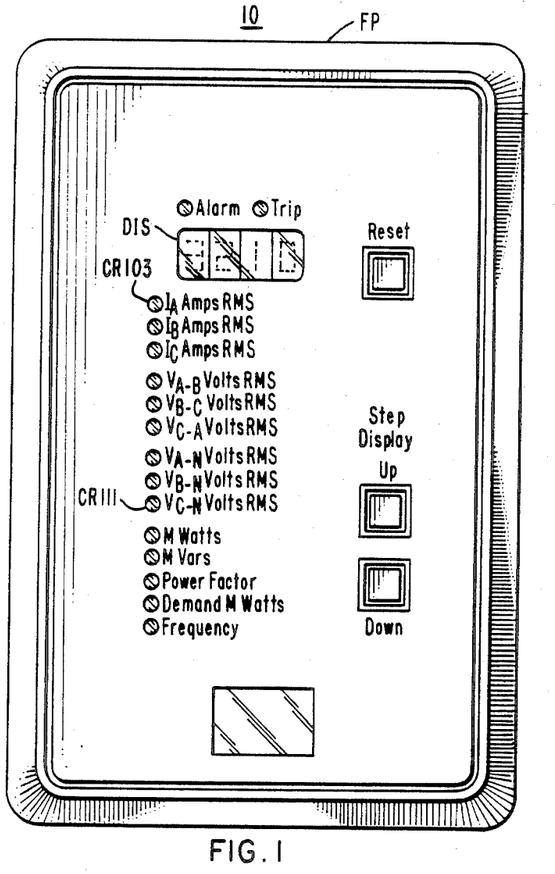
FIG. 1 shows the front panel of a master metering module which embodies the present invention.

Referring now to the drawings and FIG. 1 in particular, the front panel FP for a master metering module 10 is shown. There is provided thereon a display device DIS which may contain four read-out devices numbered "0", "1", "2" and "3" which may operate in a manner which will be described hereinafter. There are also provided numerous light-emitting diodes CR103 and CR111 for example, which have appropriate front panel indicia associated therewith. The operation of the latter light-emitting diodes relative to the readout on the display DIS will be described hereinafter. There are provided "STEP DISPLAY" switches "UP" and "DOWN" which may be manipulated so that the light-emitting diodes are chosen as desired to indicate which function is being monitored by the module 10 and shown on the display DIS. In this embodiment of the invention the display devices for the first nine light-emitting diodes LED CR103 through CR111 (see FIG. 2F) are described. The stepped outputs may start with the output identified as "$I_A$ Amps RMS" and end with the output identified as "$V_{C-N}$ Volts RMS" in this embodiment of the invention.

CONSTRUCTION

Referring now to FIGS. 2A through 2F, a schematic circuit diagram partially in block diagram form for those portions of the master metering module 10 of FIG. 1 which are related to the present invention is depicted. Input terminals 22, 24, 26, and 28 are shown. These terminals may have impressed thereon voltages VA, VB, VC, and system neutral N, respectively, for external circuits which are to be monitored, measured, or otherwise usefully operated upon by the circuitry of the present invention. With respect to a "Y-CONNECTED SYSTEM", the midpoint or neutral N thereof is connected to the terminal 28. However, with respect to the "Δ-CONNECTED SYSTEM", no neutral or midpoint is available or utilized. Terminals 22, 24, 26 are interconnected with fuses F301, F302, F303, respectively. The other side of the fuse F301 is connected to one side of resistive element R304 and one side of resistive element R310. The other side of fuse F302 is connected to one side of resistive element R306 and one side of resistive element R312. The other side of fuse F303 is connected to one side of resistive element R308 and one side of resistive element R315. In the preferred embodiment of the invention, resistive elements R304 through R315 may each comprise 1 mΩ resistors. The other side of resistive element R304 may be connected to terminal 1 of connector JPM. Likewise, the other side of resistive element R306 may be connected to terminal 2, the other side of resistive element R308 may be connected to terminal 3, the other side of resistive element R310 maybe connected to terminal 4, the other side of resistive element R312 may be connected to terminal 5, and the other side of resistive element R315 may be connected to terminal 6 of the aforementioned connector JPM. Also connected to the other end of fuse F301 is terminal 7 of the aforementioned connector JPM. Connected to the other side of fuse F302 is terminal 8 of the aforementioned connector JPM and, finally, the other side of resistive element F303 is connected to terminal 9 of connector JPM. The voltages on the latter-mentioned other sides of fused elements F301, F302, F303 are designated VAF, VBF, VCF, respectively. All of the aforementioned resistive elements, connectors, fuses, terminals, and the like, may be disposed in a power module PM.

Figure 2A:
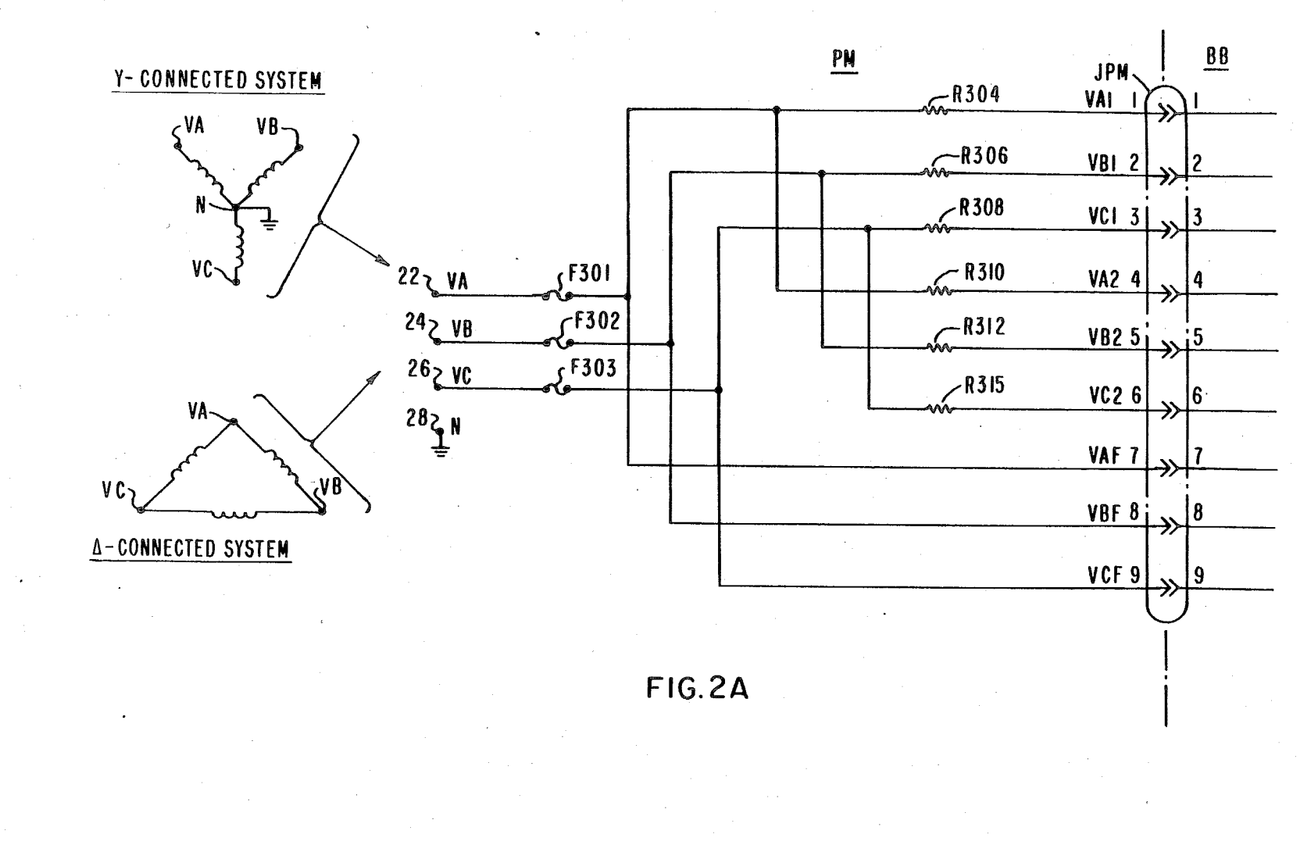
FIG. 2A through 2F depict partially in circuit diagram form and partially in block diagram form the electrical circuit for that portion of the master metering module which is the subject of the present invention.
Figure 2B:
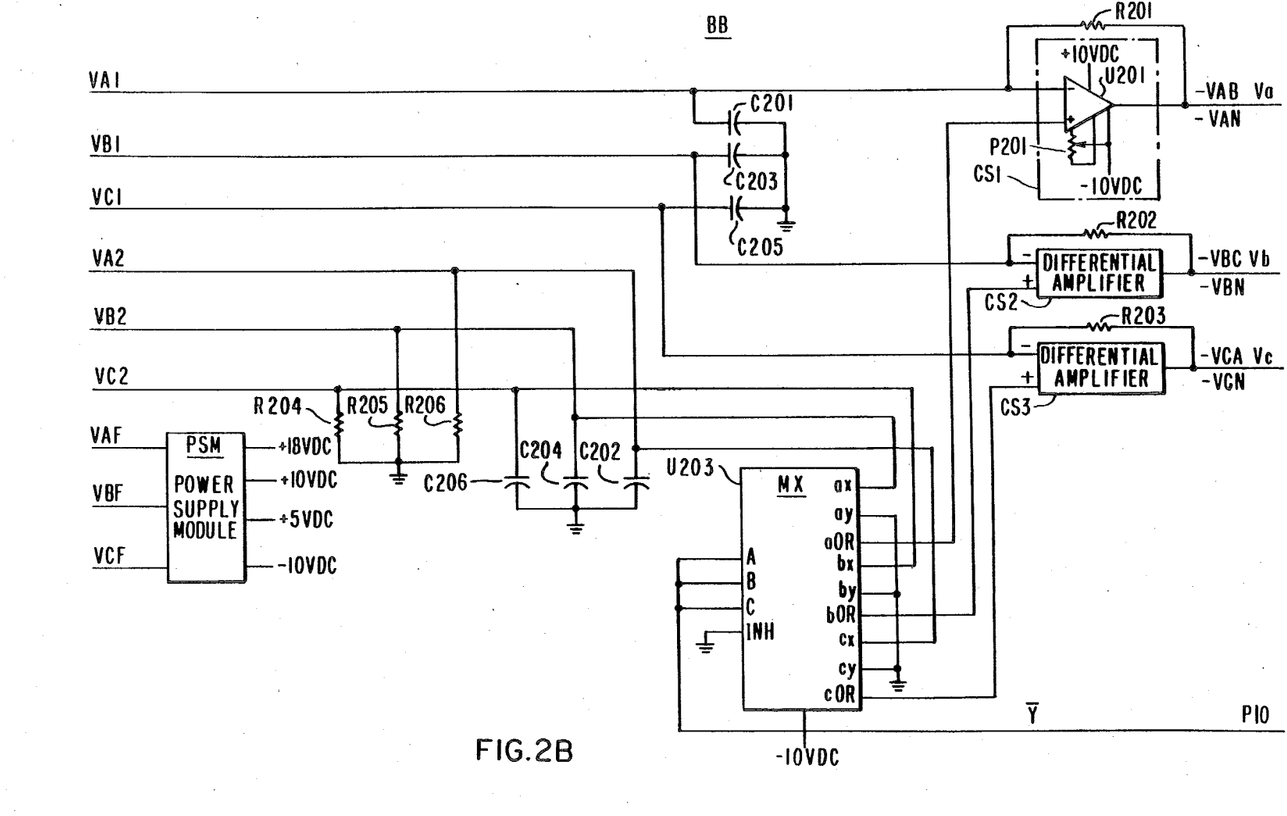
Figure 2C:
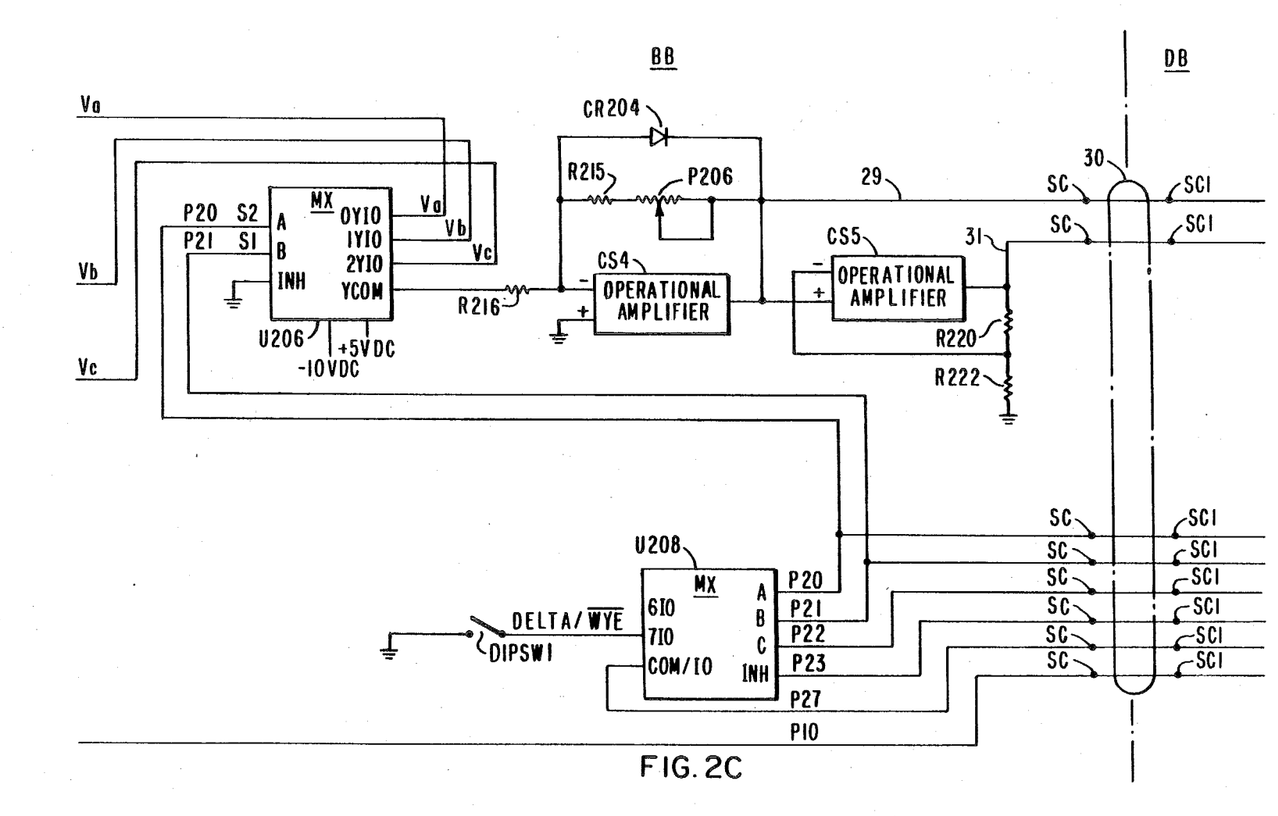

As shown in FIGS. 2A, 2B and 2C there is also provided a backboard BB upon which other appropriate circuit elements and components are disposed. Output terminals 1 through 6 of connector JPM may have voltages VA1, VB1, VC1, VA2, VB2, VC2, respectively disposed thereon. Output terminals 7, 8, 9 of connector JPM are input terminals for a power supply module PSM which may provide appropriate DC power for the metering module circuit elements described and depicted herein. In a preferred embodiment of the invention, +5 volts DC, +10 volts DC, −10 volts DC and +18 volts DC are provided. Connected to output terminal 1 of connector JPM is one side of capacitive element C201 and the negative input terminal of operational amplifier system CS1. Resistive element R201 is interconnected between the aforementioned negative input terminal of the differential amplifier system CS1 and the output terminal thereof. Differential amplifier system CS1 includes an operational amplifier U201 and an appropriately connected potentiometer P201 which is useful for eliminating offset voltage. In addition +10 volt DC and −10 volts DC are supplied to the system CS1 for empowering it. The output signal for the system CS1 is designated as either −VAB or −VAN, depending upon whether a Δ-type electrical system or a Y-type electrical system is monitored at the input terminals 22, 24, 26, 28. The output voltage −VAB or −VAN, as the case may be, is generally designated Va. In a like manner, output terminal 2 of connector JPM is connected to one side of capacitive element C203 and to the negative input terminal of system CS2. Resistive element R202 bridges the negative input terminal and output terminal of the system CS2. The input voltage for the negative input terminal of system CS2 is designated VB1, while the output voltage is designated either −VBC or −VBN, as the case may be for the reason described previously with respect to comparator system CS1. The output voltage for the system CS2 is generally designated Vb. The output terminal 3 of connector JPM is interconnected with one side of capactive element C205 and with the negative input terminal of system CS3. The bridging resistor R203 interconnects the negative input terminal of the system CS3 with the output terminal thereof. Voltage VC1 is interconnected with the aforementioned negative input terminal of the system CS3. The output voltage is either -VCA or -VCN, as the case may be, for the reason described previously with respect to systems CS1, CS2. These latter two alternative voltages as the case may be are designated Vc. Systems CS2, and CS3 may generally be internally the same as that depicted within the block CS1 as described previously.

There is provided a microprocessor controlled 3 channel, solid-state, digital switch or multiplexer U203 which is capable of routing a signal on any one of two alternate input terminals to a common output terminal for three different switch arrangements. One set of input terminals is designated ax, bx, cx, respectively. The other set of input terminals is designated ay, by, cy, respectively. The common output terminal is designated aOR, bOR, cOR, respectively. There are provided three microprocessor-controlled input terminals A, B, C, respectively, which are interconnected with a microprocessor U112 to be described hereinafter, at output terminal P10 thereof for control of the digital switch U203 by the output signal $\overline{Y}$. Depending upon the digital value of $\overline{Y}$ as applied to input terminals A, B, C, signals on the appropriate combination of input terminals ax, ay, etc. as described previously may be routed to common output terminals aOR etc. as described previously. The output terminal aOR is interconnected with the positive input terminal of U201 of the system CS1. The output terminal bOR is connected to the positive input terminal of the system CS2. The output terminal cOR is connected to the positive input terminal of the system CS3. The input terminal ax is connected to output terminal 5 of connector JPM which carries the voltage VB2. The input connector bx is connected to the output terminal 6 of the connector JPM which carries voltage VC2. The input terminal cx of the switch U203 is also connected to the output terminal 4 of connector JPM and carries the voltage VA2. Output terminal 4 of connector JPM is connected to one side of capacitive element C202 and one side of resistive element R206. Output terminal 5 of connector JPM is also connected to one side of capacitive element C204 and one side of resistive element R205. Finally, output terminal 6 of connector JPM is also connected to one side of capacitive element C206 and one side of resistive element R204. All of the other sides of capacitive elements C201 through C206 are grounded, and all of the other sides of resistive elements R204, R205, R206 are also grounded. In addition, all the input terminals, ay, by, cy for switch or multiplexer U203 are grounded, as well as the inhibit INH input terminal for the switch or multiplexer U203. In the preferred embodiment of the invention, feedback resistive elements R201, R202, R203 have 5 kΩ values and potentiometers P201, P202, P203, have 100 kΩ values. In the preferred embodiment of the invention, resistive elements R204 through R206 also have 5 kΩ values and capacitive elements C201 through C206 have 0.001 μF values.

As best shown in FIG. 2C there is also provided on backboard BB a four channel multiplexer U206 which may be empowered by +5 V DC power and −10 volt DC power. Control terminals A and B thereof are interconnected with terminals P20, P21 of microprocessor U112. Signal S2 is on line P20 at control terminal A, and signal S1 is on line P21 at control terminal B. The inhibit terminal INH is grounded. Connected to input terminal 0YIO is the previously described voltage signal Va from comparator system CS1. Connected to input terminal 1YIO is the voltage signal Vb from comparator system CS2; and connected to input terminal 2YIO is the voltage signal Vc from comparator system CS3. Depending upon the digital arrangement of the combination of the signals S1, S2, one of the aforementioned input terminals 0YIO, 1YIO, or 2YIO is interconnected with the common output terminal YCOM thereof, terminal YCOM is connected by way of resistive element R216 to the negative input terminal of amplifier system CS4 which may be similar to systems CS1 through CS3 as described previously. The positive input terminal for the comparator system CS4 is grounded. Connected between the negative input terminal and output terminal of comparator system CS4 is the serial combination of resistive element R215 and a two-point potentiometer P206. In practice, the sum of the resistance values of resistor R215 and potentiometer 206 is generally made equal to the resistance value of resistor R216, with the potentiometer P206 being provided to allow some slight adjustment. This resistance arrangement cooperates with the system CS4 to provide an inverting amplifier for the signal YCOM with a gain of approximately one. Furthermore, a diode CR204 is connected with its anode connected to the negative input terminal of the comparator system CS4 and its cathode connected to the output terminal of comparator system CS4. This provides half-wave rectification for the analog signal provided at the output terminal YCOM of the multiplexer U206. That information is provided to line 29 and to the positive input terminal of amplifier system CS5 which may be similar to comparator systems CS1 through CS4 described previously. A negative input terminal of the aforementioned comparator system CS5 is connected by way of resistive element R220 to the output terminal thereof. The negative input terminal is also connected by way of resistive element R222 with ground. The latter resistance arrangement represented by the combination of resistive element R222 and resistive element R220 generates an amplification factor for the comparator system CS5. In a preferred embodiment of the invention resistor R220 has a 15 kΩ value and resistor R222 has a 5 kΩ value thus providing an overall amplification factor of four. Consequently, the system CS5 utilized in conjunction with the previously named inputs provide a gain of 4, for the output signal from the system CS4. The output from the CS5 is provided on line 31.

There is also provided on the backboard BB a dip-switch arrangement in which dip switch DIPSW1 is interconnected at one end thereof with ground and at the other end thereof respectively to the 7IO input terminal of an analog multiplexer U208. The multiplexer U208 is controlled at its A, B, C, and inhibit INH control terminals by the signals S2, S1, R2, R1, respectively, of the microprocessor outputs P20, P21, P22, P23, respectively. Depending upon the digital code present at the control terminals A, B, C, the 7IO input terminal is connected to the output terminal COM/IO of multiplexer U208. This latter output terminal is connected to the P27 input terminal labeled READ-CTS of the microprocessor U112. The input signal DELTA/$\overline{WYE}$ is provided by way of dip switch DIPSW1 to input terminal 7IO.

Figure 2D:
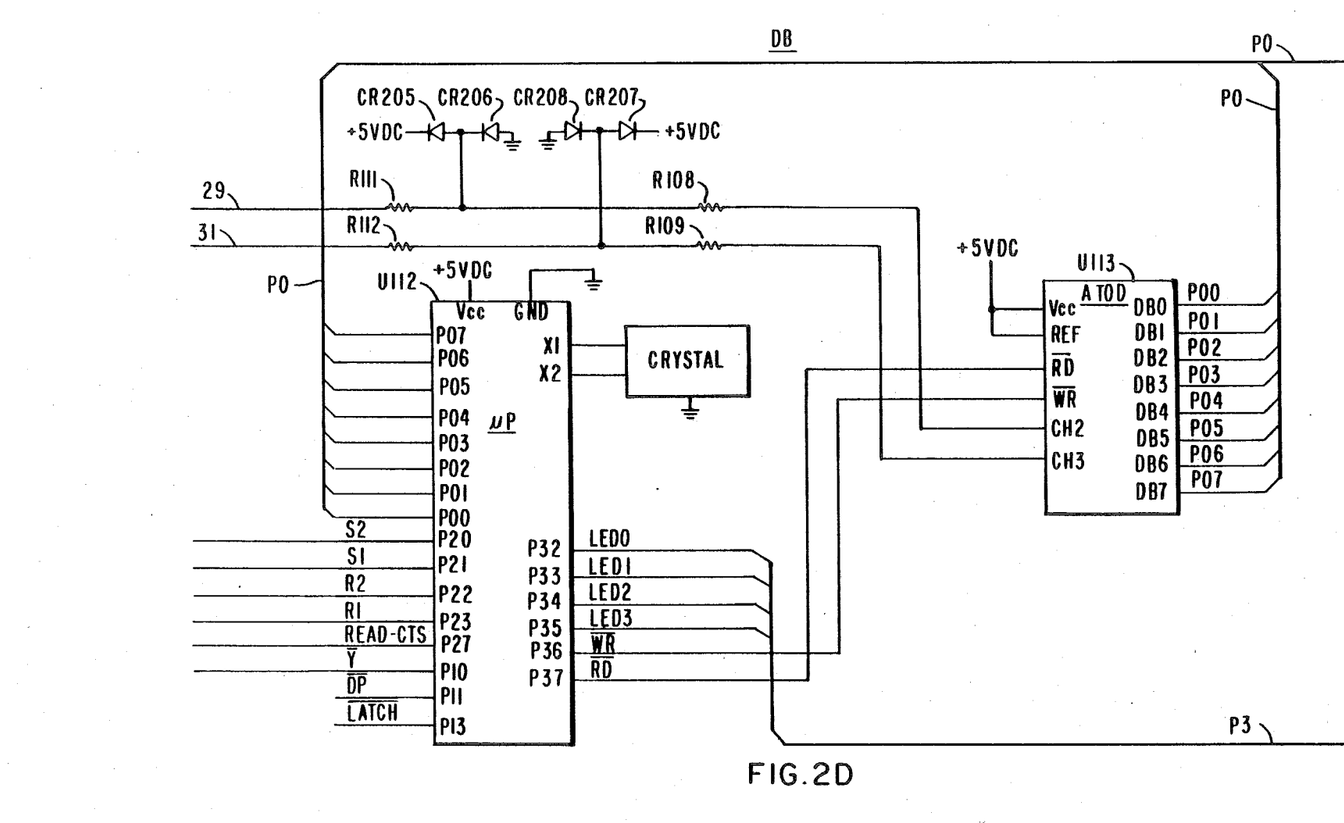

As best shown in FIGS. 2C, 2D, 2E and 2F, there is provided a display board DB which has disposed thereon the microprocessor U112 and its associated circuitry, an analog-to-digital converter U113 and its associated circuitry, display devices U104 through U107 and associated circuitry and devices CR103 through CR111 and associated circuitry. Microprocessor U112 may be empowered by the +5 volt power supply voltage at terminal Vcc thereof. The microprocessor U112 may also be appropriately grounded at terminal GND. Connected to the X1, X2 clock terminals of microprocessor U112 is a crystal. There are provided on the left of microprocessor U112 as shown in FIG. 2D input/output terminals P00 through P07, which together form part of a bus P0. Bus lines P11, and P13 provide the output signal $\overline{DP}$, $\overline{LATCH}$, respectively, the use of which will be described hereinafter. As was described previously, outputs P20 through P23, which also provide signals S2, S1, R2, R1, respectively are also shown on the left of the microprocessor U112. There are also provided terminals P32 through P37 in which the following signals are provided, respectively: LED1, LED1, LED2, LED3, $\overline{WR}$, and $\overline{RD}$. These terminals are connected to lines which make up cable P3. Write and read signals $\overline{WR}$ and $\overline{RD}$ are also present on the right. The use of these signals will be described hereinafter. In a preferred embodiment of the invention, the output lines P20, P21, P22, P23, P27, P10, conductor 29, and conductor 31 are connected to solder connections SC on the backboard BB. From there, a ribbon cable 30 carries these conductors in parallel to similar solder connections SC1 on the display board DB. Utilized in this way, an expensive connector can be eliminated, thus increasing the overall cost efficiency of the system.

There is also provided on Display Board DB an analog-to-digital converter system utilizing an eight bit analog-to-digital converter U113 and its associated circuitry. Connected to conductor 29 is one side of resistive element R111, the other side of which is connected via resistive element R108 to the CH2 input of the analog-to-digital converter U113. Connected to conductor 31 is one side of resistive element R112, the other side of which is connected via resistive element R109 to the CH3 input of A/D converter U113. Connected to the junction between resistive elements R111. R108 is the anode of a diode CR205 and the cathode of a diode CR206. The cathode of the diode CR205 is connected to the +5 volt power supply terminal and the anode of the diode CR206 is connected to ground. In a like manner, connected to the common junction between the resistive element R112 and resistive element R109 is the anode of diode CR207 and the cathode of diode CR208. The cathode of the diode CR207 is connected to the +5 volt power supply terminal and the anode of diode CR208 is connected to ground. These diode arrangements act as voltage clamping devices. Connected to the $\overline{RD}$ and $\overline{WR}$ input terminals to the A/D converter U113 are the P37 and P36 output terminals of the microprocessor U112 which contain the $\overline{WR}$ and $\overline{RD}$ signals. Connected to the Vcc power supply terminal of the A/D converter U113 is +5 volt DC power. Connected to the reference REF input terminal of A/D converter U113 is also the +5 volt DC power supply terminal. The analog-to-digital output or digital terminals DBO through DB7 are interconnected through the aforementioned digital bus P0 to the corresponding terminals P00 through P07 of the microprocessor U112 so that information may be exchanged between the two devices. In the preferred embodiment resistors R108, R109, R111 and R112 have 1,000 Ω values.

Figure 2E:
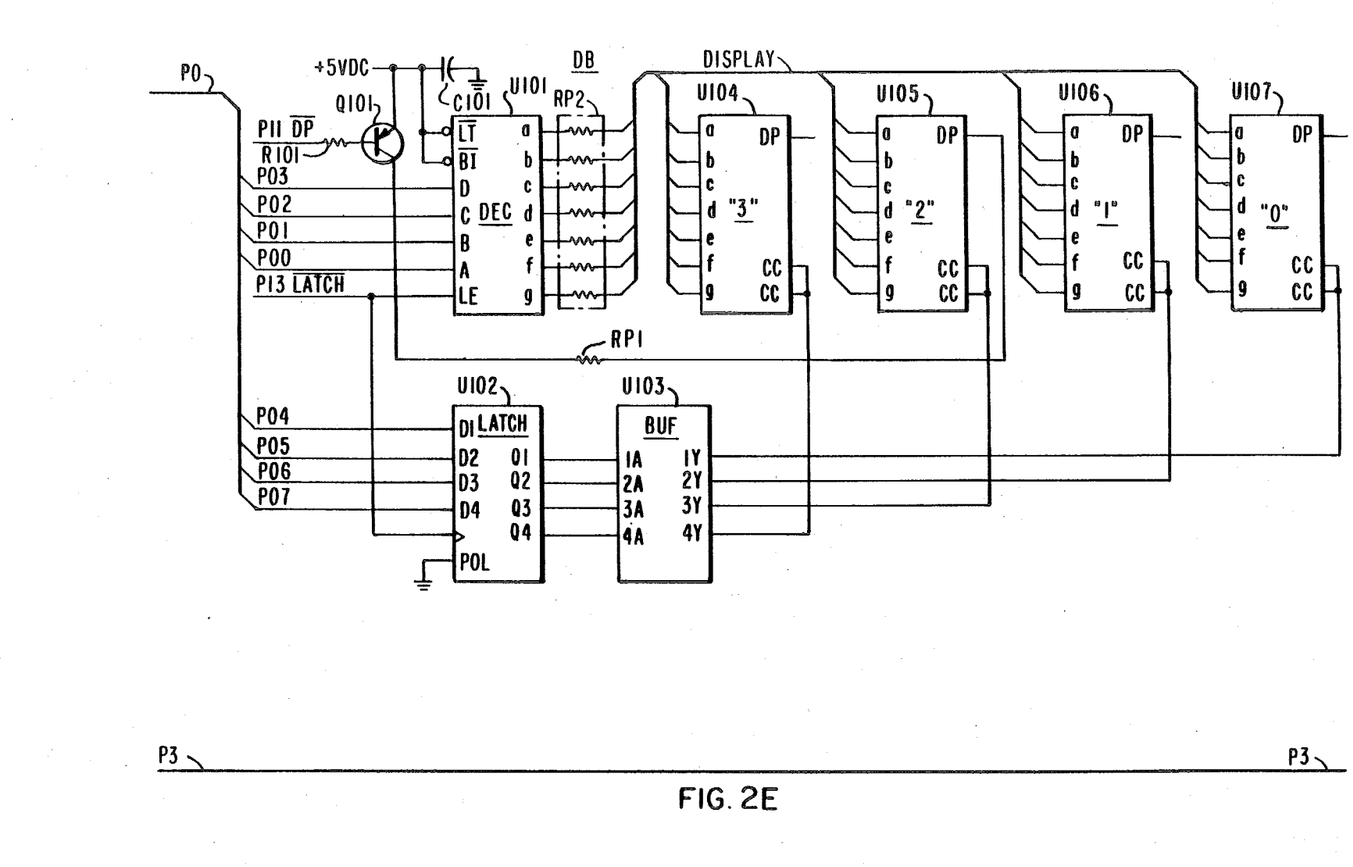

As best shown in FIG. 2E, also disposed on the display board DB is a display system which provides output readout data for the front panel FP depicted in FIG. 1. There is provided an input transistor Q101, the base of which is connected via resistor R101 to the P11 terminal of microprocessor U112. This latter line or conductor carries the $\overline{DP}$ control signal. The emitter of the transistor Q101 is connected to the +5 volt power supply, while the collector thereof is connected via resistive elements RP1 to the DP input terminal of V105 which is a seven segment LED display. Light-emitting diode displays numbered "0," "1," "2," "3," are designated U107, U106, U105, U104, respectively. These are shown at DIS on the front panel FP of FIG. 1. There is provided a binary-coded decimal (BCD) to seven segment decoder/drive or U101. For U101, the A, B, C, and D, input terminals thereof are connected to the P00, P01, P02, P03 lines of the microprocessor U112 by way of bus P0. The seven output signals are designated a, b, c, d, e, f, and g respectively. These are used for illuminating the seven different light-emitting diodes in the displays U104 through U107. These lines are interconnected through resistors RP2 by way of a common "DISPLAY" bus to the a, b, c, d, e, f, and g input terminals of the readout devices U104 through U107. The decoder U102 has its inputs D1 through D4 connected to the terminals P04 through P07 of of the microprocessor U112 by way of bus P0. The signals thereon are utilized to selected outputs Q1, Q2, Q3, Q4 which are interconnected to a buffer or light-emitting diode driver U103 at terminals 1A, 2A, 3A, 4A, respectively. The outputs 1Y, 2Y, 3Y, 4Y, respectively of Buffer U103 are connected to the common cathode terminals CC of the readout devices U107, U106, U105, U104, respectively, for selecting one of those devices for being illuminated by signals in the "DISPLAY" line. Resistor R101 may have a value of 1000 Ω in the preferred embodiment of the invention.

Figure 2F:
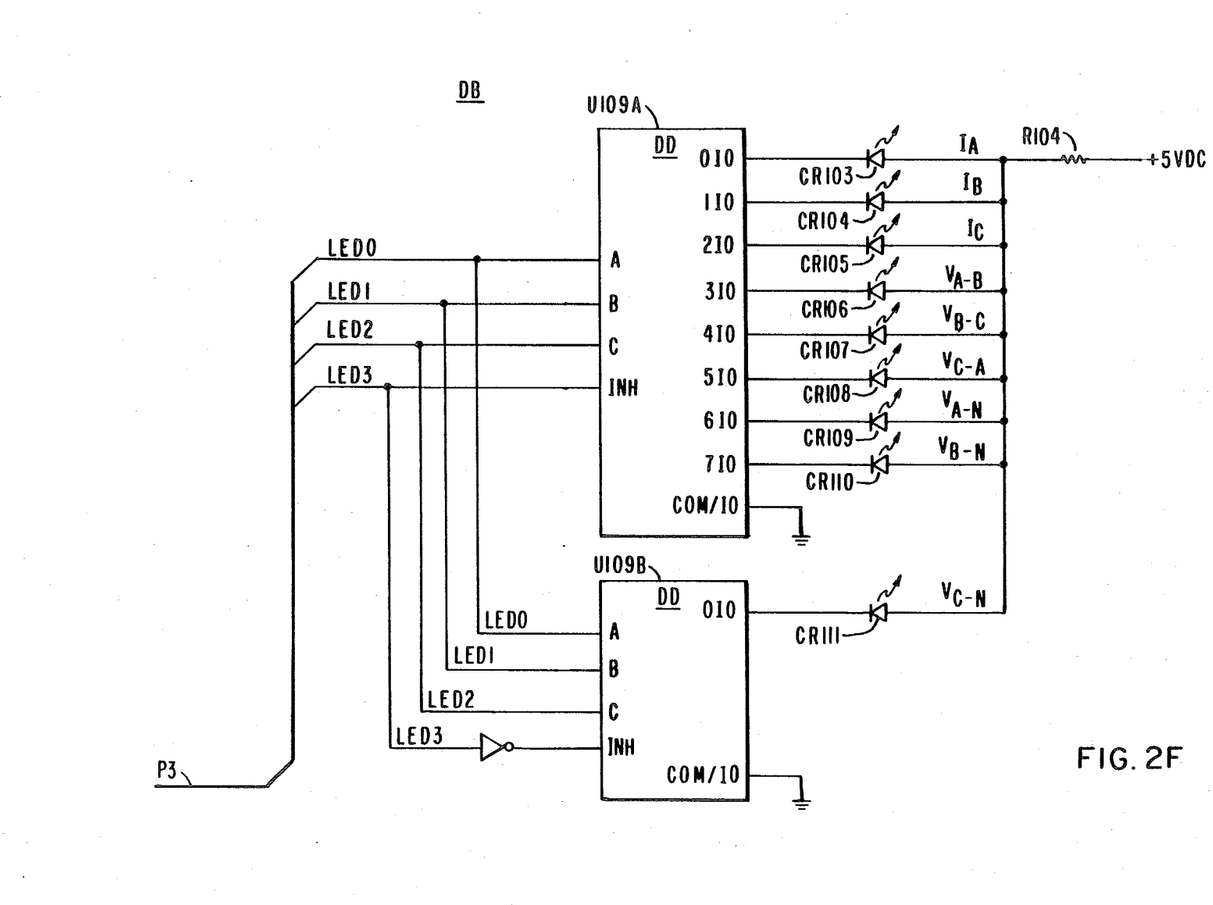

As best shown in FIG. 2F, there is also provided a light-emitting diode driver or multiplexer U109A which has a terminal COM/IO (which is interconnected with ground) and eight selectable input terminals 0IO, 1IO, 2IO, 3IO, 4IO, 5IO, 6IO, and 7IO which may be internally interconnected to ground by way of the common terminal COM/IO in response to appropriate digital values on the control terminals A, B, C, and INH thereof. Designations corresponding to the front panel indicia are shown. Each of the aforementioned terminals 0IO through 7IO are connected by way of light-emitting diodes CR103 through CR110 (also shown in FIG. 1), respectively, to the +5 volt power supply through a current limiting resistor R104. Consequently, as each of the inputs 0IO through 7IO is chosen, a complete circuit is formed from the +5 volt power supply through resistor R104, through the appropriate light-emitting diode to ground via the COM/IO terminal, thus illuminating the selected light-emitting diode. Light-emitting diodes CR103 through CR110 are designated "$I_A$", "$I_B$", "$I_C$", "$V_{A-B}$", "$V_{B-C}$", "$V_{C-A}$", "$V_{A-N}$" and "$V_{B-N}$" respectively. In a like manner, a second light-emitting diode driver multiplier U109B (which may be the same as U109A) is provided with similar input and output connections for driving the light-emitting diode CR111 represented by the designation legend "$V_{C-N}$".

OPERATION

The user of the equipment connects the Y or Δ connected system, shown to the left in FIG. 2A, to the terminals 22, 24, 26, and 28 if necessary, as required and then alerts or preconditions the microprocessor U112 as to which type of connection is being monitored by way of the dip switch DIPSW1. If a Y connected system is being monitored or utilized, then dip switch DIPSW1 is closed; if a Delta connected system is being monitored or utilized, then dip switch DIPSW1 is opened. The microprocessor U112, during its normal operating cycle, communicates with the dip switch, reading or sampling multiplexer U208 by way of control terminals P20 through P23. The status of dip switch DIPSW1 is read out to terminal P27 of the microprocessor U112 in response to combinations of control signals on lines P20 through P23. The microprocessor U112 operates in accordance with the flow chart shown in FIG. 3 (to be described hereinafter) by way of terminal P10 to connect the respective positive input terminals of the comparators CS1 through CS3, either to neutral or to output terminals 4, 5, 6 of connector JPM. When the positive terminals are connected to neutral, then the output signals Va, Vb, Vc represent voltages −VAN, −VBN, −VCN, respectively, which, of course, are winding or phase-to-neutral voltages normally associated with a Y-connected input system. If, on the other hand, the positive input terminals for the aforementioned comparators are connected to the 4, 5, 6, output terminals of the connector JPM, then voltages Va, Vb, Vc represent line-to-line voltages −VAB, −VBC, −VCA, respectively, which may be utilized in either a Y connected electrical system or a Δ-connected electrical system.

To understand more fully the aforementioned operation, it will be described with respect to an illustrated example associated with the output voltage Va of comparator system CS1 for both line-to-line and line-to-neutral voltage arrangements. If a Y-connected system is interconnected with terminals 22, 24, 26, the operator closes switch DIPSW1. This information is communicated via multiplexer U208 and input terminal P27 to the microprocessor U112 which then provides digital information by way of line P10 to multiplexer U203. This causes the positive input terminals of comparator systems CS1 through CS3 to be connected to neutral. This is done by internally connecting the ay, by, and cy terminals to the aOR, bOR, and cOR, terminals respectively of multiplexer U203. This means that comparator CS1 subtracts the voltage VA1 from the neutral voltage providing an output voltage −VAN.

If, on the other hand, the Δ-connected system is interconnected with terminals 22, 24, 26, 28 in an appropriate manner, and if the user has opened the dip switch DIPSW1, information is provided by way of multiplex switch U208 to terminal P27 of microprocessor U112 to indicate that a Δ (Delta) interconnection for the input systems has been utilized. This information is then utilized by the microprocessor U112 to provide a digital signal on terminal P10 which causes the multiplexer U203 to connect the positive input terminal of comparator system CS1, for example, to output terminal 5 of the connector JPM which represents the voltage VB2. This means that the output of the comparator system CS1 is equal to the voltage VB2 minus the voltage VA1 or, said in another way, is equal to the line-to-line voltage −VAB.

Once the appropriate voltage-sensing arrangement has been set up so that the voltages Va, Vb, Vc accurately represent the appropriate voltages of the system to be monitored, these voltages are selected periodically by the multiplexer U206. The voltages Va, Vb, Vc are full-wave analog voltages which represent line-to-line or line-to-neutral voltages on the input system as the case may be. They are provided in sequence to the inverting amplifier arrangement built around system CS4 for providing a half-wave rectified, gain-of-minus-one, analog representation of the aforementioned input voltage values. This half-wave, gain-of-minus-one signal is provided by way of line 29 through the appropriate lead in ribbon conductor 30 and through resistors R111, R108 to input channel or terminal CH2 of the analog-to-digital converter U113. The clamping circuit comprising diodes CR205, CR206, the 5-volt power supply, and system ground prevents the input analog half-wave rectified voltage signal for channel CH2 from exceeding 5 volts peak which, in a preferred embodiment of the invention, is required to ensure that the analog-to-digital converter U113 is not physically harmed by the level of the input voltage thereto. The output from the inverting amplifier CS4 changes the voltages −VAB, −VBC, −VCA, to voltages +VAB, +VBC, +VCA, respectively. It is the latter positive voltages which are utilized by the microprocessor U112 in a meaningful manner. It is to be noted that the line-to-neutral voltages −VAN, etc. where utilized, are converted to voltages +VAN, VBN, VCN, respectively, for accomplishing the same purpose. The half-wave rectified and inverted voltages at the output of comparator system CS4 is supplied to a gain-of-four (x4), noninverting, amplifier system built around the system CS5. This gain-of-four, half-wave rectified, analog signal is provided by way of resistive elements R112, R109 to the CH3 terminal of the A/D converter U113. A clamping circuit comprising diodes CR207, CR208 is provided for this latter signal for the reasons described previously. The appropriate A/D converter input channel CH2 or CH3 is chosen for digitization by utilizing the $\overline{\text{READ}}$ RD, $\overline{\text{WRITE}}$ WR, and P0 bus terminals of the microprocessor U112. Information concerning which of the two channels to choose is provided initially by way of the latter lines during a read operation. In the preferred embodiment of the invention, channel CH3 (gain-of-four) is initially chosen. The analog-to-digital signal converter U113 provides an eight-bit parallel digital output signal on its output terminals DB0 through DB7 in response to a $\overline{\text{WRITE}}$ command provided by the microprocessor U112. This latter digital output signal is provided to the P00 through P07 input terminals of the microprocessor U112 by way of bus P0. In the event that the output is saturated, i.e., all of the digital values on lines P00 through P07 are at digital "1," the microprocessor U112 operating in accordance with the the flow chart shown in FIG. 4 (to be described hereinafter) determines that the output information is invalid and therefore indicates to the A/D converter U113 that channel CH2 is to be selected for digitizing. Channel CH2 provides the same information as channel CH3 but at one-fourth the peak voltage level thereof, i.e., at a gain-of-one rather than a gain-of-four value. The read/write sequence is repeated using channel 2. The microprocessor U112 then takes this information and during a subsequent operating phase for the microprocessor U112 uses this digital information for a useful purpose such as driving and illuminating indicating members on the display board DB.

Multiplexers U109A and B operating in conjunction with control signals LED0 through LED3 on input terminals A, B, C, and INH, respectively thereof provides, indication to the observer of the front panel FP shown in FIG. 1 which value is being displayed by the display device DIS. Display device DIS may include individual displays "0," "1," "2," "3" for readout devices U107, U106, U105, U104, respectively. Concurrently with this, the microprocessor provides information to decoders U101, U102 to cause the aforementioned readout devices U104 through U107 to cooperatively display a four digit number indicative of the voltage value being sampled or monitored. To accomplish this the readouts U104 through U107 are serially actuated by way of the buffer U103 and the latch U102 in such quick sequence that at the end of a sample it appears that all four readouts U104 through U107 are illuminated simultaneously even though, in fact, they are illuminated serially with reliance upon residual illumination to create the appearance of parallel illumination on the individual displays U104 through U107. Decoder U101 is a BCD-to-seven-segment decoder/-driver which determines which combination of the seven output illuminators are to be utilized in each readout interval for the devices U104 through U107. Integers or numbers are represented by these devices concurrently. However, only that device which has been actuated at its common cathode CC by the buffer U103 as described previously is driven or actuated to actively illuminate at any instant of time. The $\overline{\text{LATCH}}$ signal on line P13 actuates both U101, U102 to freeze the output thereof at an appropriate instant of time for subsequent readout even though the input data may change thereafter.

Figure 3:
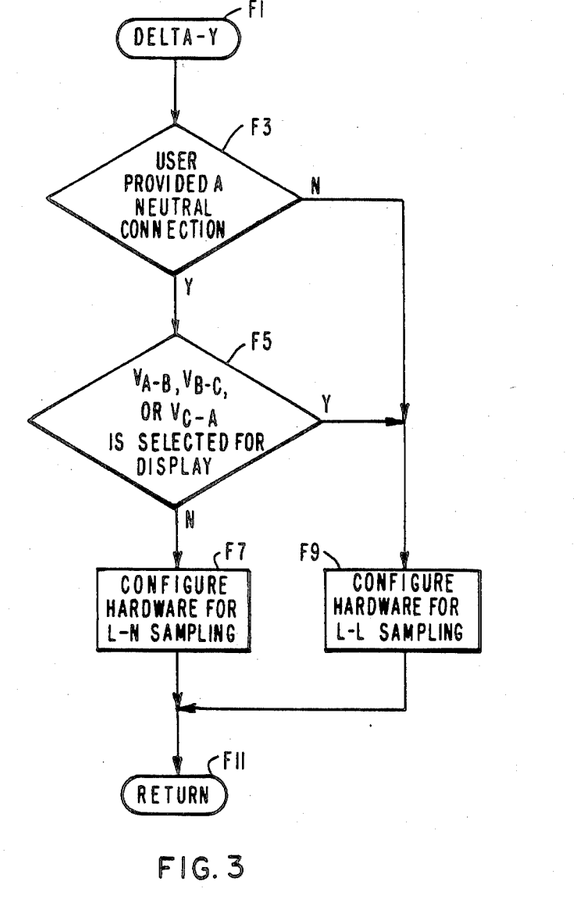
FIG. 3 shows a flow chart which may be utilized by a microprocessor for configuring the elements of the master metering module for either Δ or Y input circuit monitoring.

Referring now to FIG. 3, a flow chart may be initialized at F1 to be utilized in programming the microprocessor U112 to provide the activity associated with determining whether the Δ-type input system is being used or the Y-type system is being used is shown. The microprocessor U112 is programmed in any standard programming way to ask the question at F3 has the user provided a neutral connection? This neutral connection is shown as N in the Y-connected system of FIG. 2A. The microprocessor U112 determines the answer to the aforementioned question by sampling the dip switch DIPSW1 in the manner previously described. If dip switch DIPSW1 is closed, the microprocessor knows that the user has in fact provided a neutral connection and so the yes route (y) is taken. Had the answer been no (N), then the microprocessor U112 would know that the user had not provided a neutral connection and therefore the hardware would have to be configured for line-to-line sampling at F9. In this latter case, the microprocessor U112 would alert the multiplexer U203 to operate in the manner previously described to connect the positive input terminals of the comparator systems CS1 through CS3 to the ax, bx, and cx output terminals respectively so that line-to-line voltage sampling can be made and displayed. However if the answer to the question at F3 is yes (Y), the microprocessor U112 will then determine whether is it still desirable to display line-to-line voltages. This is done by asking the question shown at F5. If the answer is yes (Y), then the hardware will once again be configured for line-to-line sampling at F9 even though a neutral has been provided, it being recalled that in a Y connected system either line-to-line voltages can be measured or line-to-neutral voltages can be measured. If on the other hand the answer to the question posed in F5 is no (N), then the microprocessor system knows that line-to-neutral sampling is desired at F7 and the microprocessor U112 will alert the multiplexer U203 to arrange the positive input terminals of the comparator systems CS1 through CS3 to be connected to neutral. The microprocessor then exits the subroutine at F11.

Figure 4:
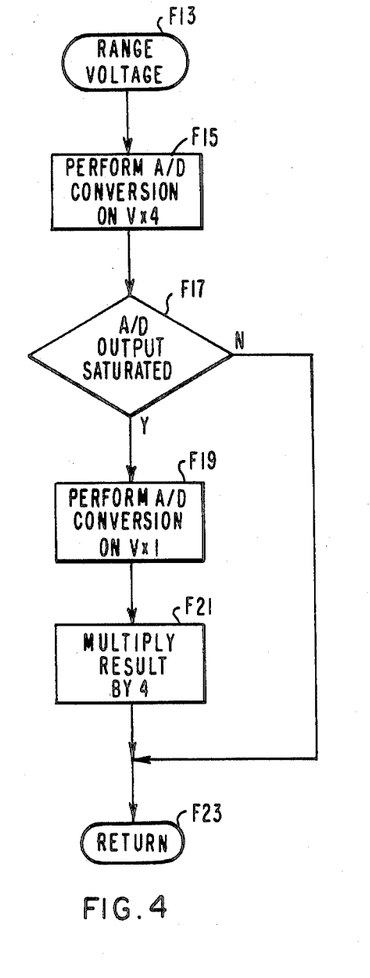
FIG. 4 shows a flow chart which may be utilized by a microprocessor for determining which range of voltage is to be used for an analog-to-digital converter input.

Referring now to FIG. 4, a flow chart for determining which input is to be utilized by the A/D converter U113 and which scaling or range factor is to be utilized by the microprocessor U112 in relation thereto is shown. The microprocessor U112 is programmed at F15 to perform an A/D conversion on the V times 4 input channel or channel CH3 as shown in FIG. 2D. Utilizing functional block F17 of FIG. 4, the microprocessor U112 then tests the output of the A/D converter U113 to determine if it has been saturated in a manner described previously. If the answer is no (N), then it can be presumed that the input analog data has been accurately digitized and the microprocessor U112 then exits the present subroutine at F23. However, if the answer to the aforementioned question at F17 is yes (Y), then the microprocessor U112 is alerted to change the input channel which is digitized by the digitizer U113. It does this by communicating back to the digitizer U113 in a manner previously described that an input channel shift is to take place. Channel CH2 is then chosen and an analog to digital conversion of the analog input data present thereon is performed at F19. It will be recalled that this is the same signal which is provided to channel CH3 except that it is one-fourth as large in amplitude. This provides a greater opportunity to digitization without saturating the parallel output lines of the A/D converter U113. Once this has been done and the information is provided to the microprocessor U112 by way of the bus P0. The microprocessor U112 then accommodates for the difference in level by multiplying the data by a factor of four at F21 to compensate for the one-fourth reduction which the switching to channel CH2 caused. The microprocessor then exits the subroutine at F23.

For the preferred embodiment of the invention, reference is made to Table 1 in which commercially available devices utilized herein are described.

TABLE 1

| REFERENCE SYMBOL | DESCRIPTION | MANUFACTURE | CATALOG |
|---|---|---|---|
| U101 | BCD to seven-segment latch decoder driver | RCA | 4511 |
| U102 | latch | RCA | 4042 |
| U103 | inverter LED driver | RCA | SN75492 |
| U104 | seven-segment display (RED) | Siemens | HD1107R |
| U105 | seven-segment display (RED) | " | " |
| U106 | seven-segment display (RED) | " | " |
| U107 | seven-segment display (RED) | " | " |
| U109A | analog multiplexer/demultiplexer | RCA | 4051 |
| U109B | analog multiplexer/demultiplexer | " | " |
| U112 | 8-bit microcontroller | Intel | 80C51 |
| U113 | analog-to-digital converter | National | ADC0844 |
| U201 | operational amplifier | RCA | TL083A |
| U203 | 2-channel multiplexer/demultiplexer | RCA | 4053 |
| U206 | differential 4-channel multiplexer/demultiplexer | RCA | 4052 |
| U208 | analog multiplexer/demultiplexer | RCA | 4051 |
| Q101 | PNP transistor | Motorola | 2N2907 |

The invention taught herein has many advantages. One advantage lies in the fact that by utilizing a microprocessor controlled switching arrangement, the master metering module may be utilized on a diverse assortment of electrical systems such as a Y-connected electrical system or a Δ-connected electrical system without necessitating customizing the metering module either in the factory or in the field to the electrical system being utilized. The wide range of utilization is accomplished by programming the microprocessor to recognize an operator-provided switch input which tells the microprocessor, for example, whether a Y-connected system is being utilized or a Δ-connected system is being utilized. Once the microprocessor knows this, it can configure the components in the metering module to act accordingly. The advantage in this lies in low cost and ease of installation and use.

We claim:

1. Circuit apparatus of the kind which produces an output signal which is related to the difference between a first line voltage and either a second line voltage or neutral when present, comprising:
   terminal means for receiving said first line voltage, said second line voltage and said neutral when present;
   microprocessor controlled switch means having an output terminal and first and second switch means input terminals, said first switch means input terminal being connected to said second line voltage at said terminal means and said second switch means input terminal being connected to said neutral when present at said terminal means, said microprocessor controlled switch means also having a control terminal which is utilized to connect said first and said second switch means input terminal to said output terminal of said switch means;

differential means having an output terminal and having a pair of input terminals for being interconnected at one of said pair of input terminals to said first line voltage at said terminal means and for being interconnected at the other of said pair of input terminals to said input terminal of said microprocressor controlled switch means; and first programmable means for being actuated to indicate if a neutral is present;

second programmable means for being actuated to indicate if line-to-line voltage is desired;

microprocessor means connected to said control terminal of said switch means, said first programmable means and said second programmable means for being conditioned to provide a control signal to said microprocessor controlled switch means for interconnecting said first switch means input terminal to said output terminal thereof when said first programmable means indicates a neutral is not present or when said first programmable means indicates a neutral is present and said second programmable means indicates line-to-line voltage is desired or for interconnecting said second switch means input terminal to said output terminal when said first programmable means indicates a neutral is present and said second programmable means indicates line-to-line voltage is not desired, so that the output terminal of said differential means provides an output signal which is related to the difference between said first line voltage and said second line voltage or the difference between said first line voltage and neutral when present depending upon the condition of said microprocessor means.

2. The combination as claimed in claim 1 wherein said differential means comprise a differential amplifier.

3. The combination as claimed in claim 2 wherein said neutral when present is at ground potential.

4. A voltage monitor means of the kind which provides an indication output signal which is related to the potential difference between a first line voltage and either a second line voltage or neutral when present, comprising:

indicating means having an input terminal and an output for providing said indication;

terminal means for receiving said first line voltage, said second line voltage and said neutral when present;

microprocessor controlled switch means having an output terminal and first and second switch means input terminals, said first switch means input terminal being connected to said second line voltage at said terminal means and said second switch means input terminal being connected to said neutral when present at said terminal means, said microprocessor controlled switch means also having a control terminal which is utilized to connect said first and said second switch means input terminal to said output terminal of said switch means;

differential means having an output terminal which is connected to said input terminal of said indicating means and having a pair of input terminals for being interconnected at one of said pair of input terminals to said first line voltage at said terminal means and for being interconnected at said other of said pair of input terminals to said output terminal of said microprocessor controlled switch means; and first programmable means for being actuated to indicate if a neutral is present;

second programmable means for being actuated to indicate if line-to-line voltage is desired;

microprocessor means connected to said control terminal of said switch means, said first programmable means and said second programmable means for being conditioned to provide a control signal to said microprocessor controlled switch means for interconnecting said first switch means input terminal to said output terminal thereof when said first programmable means indicates a neutral is not present or when said first programmable means indicates a neutral is present and said second programmable means indicates line-to-line voltage is desired or for interconnecting said second switch means input terminal to said output terminal when said first programmable means indicates a neutral is present and said second programmable means indicates line-to-line voltage is not desired, so that the output terminal of said differential means provides a signal to said indicating means so that said indicating means provides said indication which indication is related to the difference between said first line voltage and said second line voltage or the difference between said first line voltage and neutral when present depending upon the condition of said microprocessor means.

5. The combination as claimed in claim 4 wherein said differential means comprises a differential amplifier.

6. The combination as claimed in claim 4 wherein said neutral when present is at ground potential.

* * * * *